(12) United States Patent
Austin et al.

(10) Patent No.: US 12,342,111 B2
(45) Date of Patent: *Jun. 24, 2025

(54) RELATIVE ADAPTIVE ENCODING

(71) Applicant: Vutility, Inc., Sandy, UT (US)

(72) Inventors: Micheal M. Austin, South Jordan, UT (US); Kody Shook Brown, West Jordan, UT (US)

(73) Assignee: Vutility, Inc., Sandy, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/624,895

(22) Filed: Apr. 2, 2024

(65) Prior Publication Data

US 2024/0251187 A1 Jul. 25, 2024

Related U.S. Application Data

(63) Continuation of application No. 17/948,114, filed on Sep. 19, 2022, now Pat. No. 11,991,490.

(60) Provisional application No. 63/261,401, filed on Sep. 20, 2021.

(51) Int. Cl.
| | |
|---|---|
| G08C 19/00 | (2006.01) |
| H03M 1/06 | (2006.01) |
| H03M 1/18 | (2006.01) |
| H04Q 9/00 | (2006.01) |

(52) U.S. Cl.
CPC .............. *H04Q 9/00* (2013.01); *G08C 19/00* (2013.01); *H03M 1/0617* (2013.01)

(58) Field of Classification Search
None
See application file for complete search history.

(56) References Cited

U.S. PATENT DOCUMENTS

| | | | |
|---|---|---|---|
| 5,583,837 A | 12/1996 | Ogino et al. | |
| 6,229,467 B1 | 5/2001 | Eklund et al. | |
| 8,860,590 B2 | 10/2014 | Yamagata et al. | |
| 9,466,417 B2 | 10/2016 | Jefferies et al. | |
| 9,774,343 B1 | 9/2017 | Liaghati | |
| 11,754,997 B2 | 9/2023 | Engelstein et al. | |
| 11,991,490 B2 * | 5/2024 | Austin | G08C 19/00 |
| 2003/0048199 A1 | 3/2003 | Zigdon et al. | |
| 2014/0361908 A1 | 12/2014 | Laird et al. | |
| 2015/0372539 A1 | 12/2015 | Livadaras et al. | |
| 2018/0034657 A1 | 2/2018 | Brown et al. | |

(Continued)

OTHER PUBLICATIONS

International Search Report and Written Opinion dated Dec. 28, 2022 for international application PCT/US2022/044147.

(Continued)

*Primary Examiner* — Curtis A Kuntz
*Assistant Examiner* — Jerold B Murphy
(74) *Attorney, Agent, or Firm* — Foley & Lardner LLP

(57) ABSTRACT

An electricity usage monitor may include a coupling component to couple the electricity usage monitor to monitor an electrical circuit, a meter to measure electricity usage of the electrical circuit, an encoder to receive, from the meter, an electricity usage measurement to generate a measurement transmission based on the electricity usage measurement, and a communication interface configured to receive the measurement transmission from the encoder and to transmit the measurement transmission into a communication network for communication to a destination on the communication network.

20 Claims, 8 Drawing Sheets

(56) References Cited

U.S. PATENT DOCUMENTS

| | | |
|---|---|---|
| 2019/0122132 A1 | 4/2019 | Rimini et al. |
| 2020/0285983 A1 | 9/2020 | Bhattacharyya |
| 2020/0374605 A1 | 11/2020 | Snook et al. |

OTHER PUBLICATIONS

Karlsson, Power Transformer Monitoring and Diagnosis using Transformer Explorer, Thesis [online], Mar. 2016 [retrieved Dec. 5, 2022]. Entire Document. Retrieved from the Internet: URL: https://www.diva-portal.org/smash/get/diva2:912439/FULLTEXT01.pdf.

PCT International Search Report and Written Opinion, Apr. 13, 2023.

\* cited by examiner

Normal Distribution Pattern

Left-skewed Distribution Pattern

Right-skewed Distribution Pattern

RELATIVE ADAPTIVE ENCODING

CROSS-REFERENCE TO RELATED PATENT APPLICATIONS

This application is a continuation of U.S. application Ser. No. 17/948,114, titled RELATIVE ADAPTIVE ENCODING, filed Sep. 19, 2022, which claims priority to U.S. Provisional Application No. 63/261,401, titled RELATIVE ADAPTIVE DECODING OR SELF-TUNING CURRENT TRANSFORMER, filed Sep. 20, 2021, which applications are incorporated herein by reference in their entirety.

TECHNICAL FIELD

The present disclosure is directed to methods and devices that sense electrical measurement variables of a conductor and measure and report those changing variables, and more particularly to monitoring methods and devices that self-tune to enhance resolution of measurement reporting.

BACKGROUND

Monitoring electricity usage can provide better information about energy consumption to help manage critical assets, mitigate unnecessary energy or equipment loss, and improve overall efficiencies (saving money and conserving valuable resources). Monitoring electricity can also facilitate understanding and insights of energy consumption by different portions of a given electrical system (e.g., individual units of a multi-unit apartment complex). The enhanced information obtained through monitoring electricity usage can enhance decision making. Better information can improve decisions.

Electricity monitoring devices that communicate sensor readings (e.g., monitoring information, measurement information) wirelessly and/or over a communication network such as the Internet can significantly enhance available information. The proliferation of the Internet-of-Things (IoT) has opened the possibility of such electricity monitoring devices that communicate monitoring information wirelessly.

In order to transmit an electrical measurement, an electrical monitoring device may utilize an analog-to-digital converter (ADC) to convert the analog reading to a digital value. An ADC can employ one or more of a variety of different circuit techniques to implement the conversion function. One technique is a look-up-table (LUT).

SUMMARY

The present disclosure is directed to devices, methods, and techniques to represent and/or transmit monitoring data (e.g., measurement data) such that precision is retained. Specifically, the present disclosure is directed to a relative-adaptive decoding scheme for transmitting monitoring data, such as wirelessly transmitting monitoring data.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
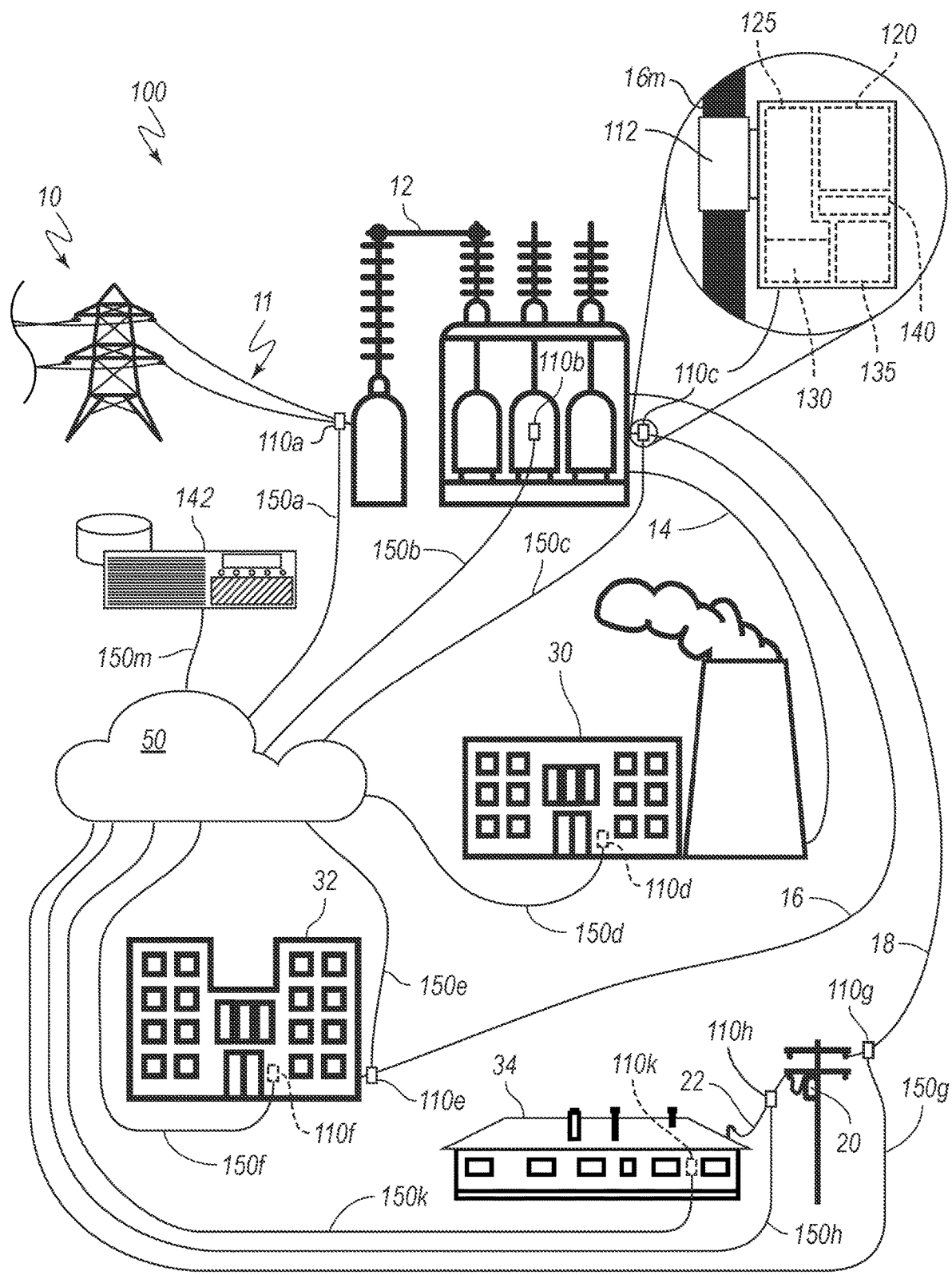
FIG. 1 depicts an electrical system including electrical monitoring, in accordance with one or more embodiments.

Active electrical monitoring requires less than 2% error in order to be "revenue grade" (e.g., compliant with a standard, such as the ANSI standard, or otherwise sufficiently accurate to allow for charging for electricity usage). Reporting accuracy at this level usually requires high precision data with numbers represented with multiple positions beyond the decimal point (for KW or KWh). Devices according to the present disclosure and/or devices implementing methods according to embodiments of the present disclosure can measure Amp-hour data in nano-Amp-hours and milli-Amp-hours in order to achieve very high precision (e.g., a bit count used for milli-Amp-hours of 64 and 42 bits, respectively).

Transmitting this high precision data over a wireless protocol, however, can be a significant challenge. High-precision data transmissions directly conflict with IoT bandwidth restrictions in many protocols (e.g. LoRaWAN can restrict an entire packet to be less than 11 Bytes; SigFox IoT is constrained to 12 Bytes and only allows 100 transmissions per day). Achieving the "revenue grade" precision requirements of electrical monitoring while transporting this important data over the tiny bandwidth of IoT protocols requires new approaches and techniques.

The present disclosure is directed to devices, methods, and techniques to represent and/or transmit monitoring data (e.g., measurement data) in small packets while preserving precision. The disclosed embodiments represent and/or transmit data without losing important precision. Specifically, the present disclosure is directed to a relative-adaptive decoding (and encoding) scheme.

The relative adaptive decoding (RAD) scheme, according to embodiments of the present disclosure, can accurately depict value deviations from a baseline (e.g., global-maximum value on a normal distribution, the peak most-frequent answer on a histogram) or standard value (like the 50 or 60 Hz frequency standard, or the Voltage standards of the US). The value's accuracy is important and a probability of values being measured can be determined based on a probability distribution, such as a normal distribution. Values closest to the baseline (e.g. global maximum value in the probability distribution) can have the highest resolution applied near this centering-point. When the deviation is very close in value to the center-point or baseline then it will be highly accurate and so more bandwidth (and thus more resolution) is reserved for these high-probability answers. However, the further away from the baseline, the less "frequent" the possibility and the less statistically important it becomes to have the same high-resolution accuracy (or the lower the risk of not meeting reporting accuracy over time because statistically the inaccuracy seldom occurs). When a measured or otherwise monitored value is close to the baseline, RAD provides extremely high-precision values. When the value is far from the baseline, accuracy is less important, and the precision can be adjusted to allow for a wider range (and consume less bandwidth).

FIG. 1 depicts an electrical system 100 including electrical monitoring, in accordance with one or more embodiments. The electrical system 100 may include or otherwise involve an electrical grid 10. A station 12 (e.g., a substation) interconnects to the electrical grid 11 at one or more electrical mains 11. The station 12 provides utility electricity service to one or more consumers (e.g., customers), such as an industrial consumer 30, a commercial or high-density residential consumer 32, and/or a residential consumer 34, via service lines 14, 16, 18. (A transformer 20 may be interposed to step down a voltage on service line 18 for delivery over a service drop line 22 to the residential consumer 34).

Electricity monitoring devices 110a, 110b, 110c, 110d, 110e, 110f, 110g, 110h, 110k (collectively electricity monitoring devices 110a-k) may be positioned at various points throughout the system 10 to monitor electricity at those various points of the system 10. As shown slightly enlarged in FIG. 1, an electricity monitoring device 110c may include a coupling (e.g., a split core current transformer to couple to a monitored service line 16m), a processor 120, memory 125, non-volatile memory 130, a communication processor 135 (e.g., a communication network interface, wireless communication network transmitter/transceiver), and an energy storage device to store harvested energy and to release the stored energy to power the processor 120, communication processor 135, and/or other components of the monitoring device 110c. The electricity monitoring devices 110a-k may be in communication with an electronic communication network 50, such as a wireless communication network (e.g., WiFi, LoRaWAN, SigFox IoT), a cloud computing network or system, and/or the Internet. A server system 142 may also be in communication with the communication network 50.

The electricity monitoring devices 110a-k can provide data transmissions or communications 150a, 150b, 150c, 150d, 150e, 150f, 150g, 150h, 150k, 150m (collectively communications 150a-m) to the communication network that can be received by the server system 142. The data can include measurement data. The communications 150a-m can include an embodiment of a RAD scheme to enable a smaller packet size while preserving precision of measurement data. As touched on above, the embodiments of a RAD scheme can be used to provide data in a form of value deviation + and − percentages from a baseline value or standard value (like the 50 or 60 Hz frequency standard, or the Voltage standards of the US). The value's accuracy is important when the deviation is very close in value to the original baseline. However, the further away from the baseline, the less important the value's accuracy becomes (or the lower the risk of not meeting reporting accuracy over time because statistically the inaccuracy seldom occurs). When a measured or otherwise monitored value is close to the baseline, RAD provides extremely high-precision values. When the value is far from the baseline, accuracy is less important, and the precision can be adjusted to allow for a wider range (and consume less bandwidth).

Histogram-behaviors (from a historical perspective) can be used to statistically predict values, which can appear like a bell curve of the FREQUENCY count of each value across a statistically significant sampling of values. A histogram can be used to summarize the frequency of certain data points that are measured on an interval scale. The histogram can provide a visual interpretation of numerical data by showing the quantity or frequency of the data points that fall within a specified range of values (called "bins" or "slots"). A histogram resembles a vertical bar graph, except that a histogram, unlike a vertical bar graph, shows no gaps between the bars. The distribution of the frequency of the values can occur in various "patterns," such as the examples shown in FIGS. 2A-2C.

Figure 2A:
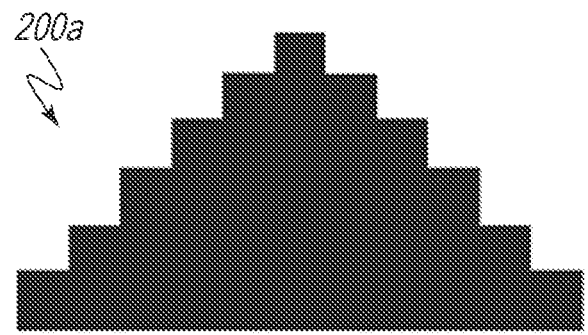
FIG. 2A depicts a normal distribution pattern, in accordance with one or more embodiments.

FIG. 2A depicts a normal distribution pattern 200a. A normal distribution appears symmetrical, where points on one side of the average are as likely to occur as often on the other side of the average. This type of distribution is how standard Utility residential 120 V AC line-voltages result with voltage variations falling on both the higher (right) side of the baseline 120 V AC value and on the lower (left) side 'equally as often'—therefore the center of a look-up table would be the center-point of the histogram (or probability distribution) and where the highest resolution would occur closest to the regulation highest "target-voltage" values.

Figure 2B:
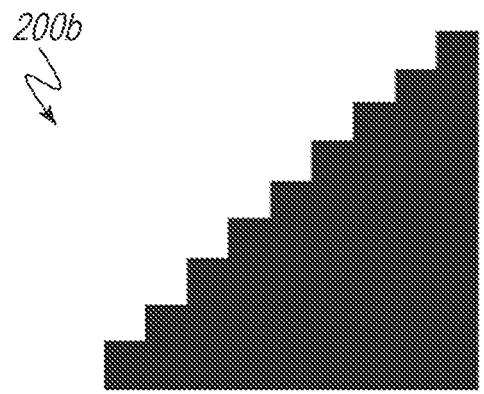
FIG. 2B depicts a left-skewed distribution pattern, in accordance with one or more embodiments.

FIG. 2B depicts a left-skewed distribution pattern 200b. A left-skewed distribution is also called a negatively skewed distribution—i.e., with the largest number of data values occurring at the top of the scale, with fewer values occurring farther left (lower) on the scale. A left-skewed distribution usually occurs when the data has a top-end boundary on the right-hand side of the histogram. For example, a boundary such as 100% as in the case of the Power Factor. It is impossible to exceed 100% efficiency on a circuit, so therefore, the top value is 100%, represented as "1". However, while this is the top end value, it may not be the most frequent occurrence of an efficiently wired and designed circuit—since "perfection" is hard to reach—e.g., 0.98 to 0.99 may be the closest to perfect "statistically" that electrical circuits might achieve. The next most frequent range may be 0.97 to 0.979, then 0.96-0.969. All values taper down from the best efficiency, but the farther the efficiency values move away from the "top values" the less frequently they occur. Therefore, embodiments of the present disclosure can widen the 'bin' or 'slot-range' represented in a look-up table without compromising the precision (and preserve bandwidth).

Figure 2C:
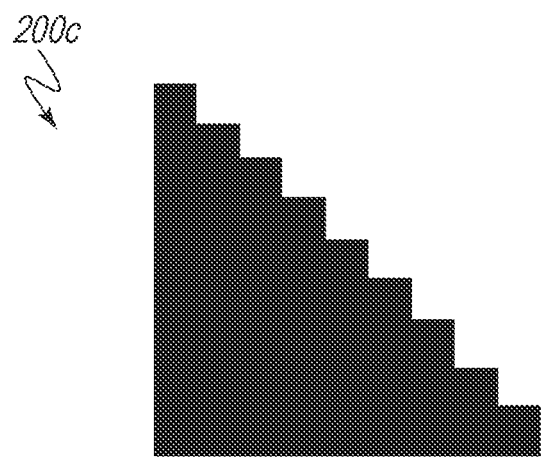
FIG. 2C depicts a right-skewed distribution pattern, in accordance with one or more embodiments.

FIG. 2C depicts a right-skewed distribution pattern 200c. A right-skewed distribution is opposite a left-skewed distribution, with the largest number of data values occurring at the bottom of the scale, with fewer values occurring farther right (higher) on the scale. A right-skewed distribution usually occurs when the data has a bottom-end boundary on the left-hand side of the histogram.

Most are familiar with at least one kind of bell-curve histogram—the "grading scale" from A, B, C, D, F. When our teachers reported that they were "grading on the scale" we learned that they were applying an assumptive rule that most of us were just 'mediocre' (that the population of student's most frequent grades would fall in the center of the scale). The teacher could be forcing their poor teaching of varied students reflected by a statistical curve where most of the students would get a C+: However, this curve breaks down when you are in an "Honor's Class" where the class is "stacked" with a bunch of really bright people—the curve in reality is skewed on the left side (where a majority should probably be getting an "A+").

Since a histogram pattern can align with the way both line voltage variations and power-factor variations occur, embodiments of the present disclosure can employ a unique process to maintain reporting precision (when it counts) and to use fewer bits (or lower bandwidth) to represent the highest percentage of "statistically-likely" VARIANCE % values. Additionally, the disclosed embodiments don't 'waste bandwidth' (or waste resolution) for "voltage" values that are unlikely to occur, but instead can translate them to a wider % variance range away from the base reference values as the data point. The %-variance frequency can be used across a sampling and can match higher resolution 'bins' with those data points that are most likely to exist. Said differently, the presently disclosed embodiments don't waste precious look-up table slots for values that aren't likely to exist—the range of variances are widened in the lowest frequency answers (e.g. values). This is particularly important when transmitting values across serial and/or wireless communications. When values are skewed so far from the baseline, accuracy is less important, but the cause of the skewed value(s) must still be resolved by the customer.

(Note that for extreme values that depart from the reference or target value, the insight gained from the data is likely always the same—"It is urgent to fix it."—The customer would not treat an 80 V AC report any differently than a 30 V AC report—something is broken and must be fixed.)

The present disclosure is directed to embodiments of devices and methods that include techniques of shrinking the size (number of bits/bytes) of the original value while still maintaining high accuracy. As an example, a percentage (1% to 100%) is generally stored in a float (4 bytes) or double (8 bytes). That gives the value a lot of granularity (usually 1.2 E-38 to 3.4 E+38 and 2.3 E-308 to 1.7 E+308 respectively).

The percentage number can also be "binned" or stored in a single byte (an unsigned char) which identifies a position in a look-up table from 0 to 255 and each bin-position represents a specific percentage value RANGE.

Figure 3:
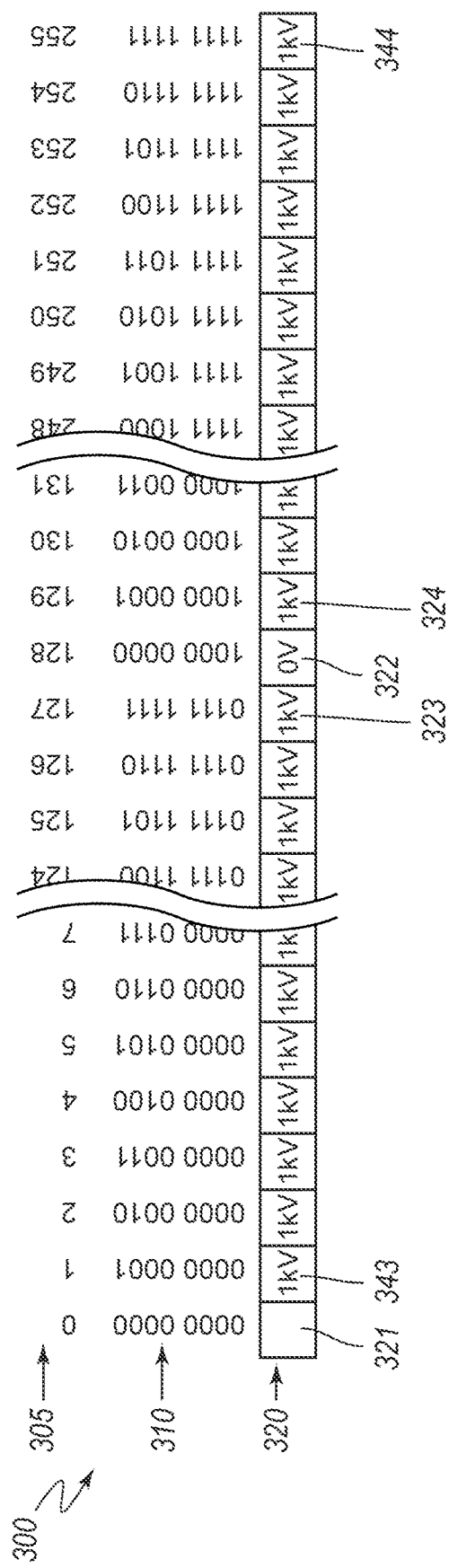
FIG. 3 is a byte map typical of existing electrical monitoring systems.

FIG. 3 is a byte map 300 typical of existing electrical monitoring systems. The byte map 300 may include numeric values 305 representing positions in the byte map 300. In some embodiments, the byte map 300 omits the numeric values 305. The byte map 300 may include bit values 310 and measurement value analog buckets 320. The bit values 310 may be the actual bits transmitted in packets. Each distinct byte of the bit values 310 may be associated with a measurement value analog bucket of the measurement value analog buckets 320. The measurement value analog buckets 320 may be arbitrary values defined in the byte map 300. The bit values 310 may be associated with measurement value analog buckets 320 having arbitrarily defined values.

The measurement value analog buckets 320 may include a target 322. The target 322 may be centered in the byte map 300 such that the target is associated with a value 128 of the numeric values 305. The target 322 may be an expected measurement value. For example, the byte map 300 may be used for measuring voltages in a residential application with an expected voltage of 120 volts and the byte map 300 may have a target 322 of 120 volts. In some embodiments, as shown here, the measurement value analog buckets 320 are denoted as relative to the target 322 such that the target 322 is 0 and the measurement value analog buckets 320 are deviations from the target 322. In other embodiments, the measurement value analog buckets 320 are actual measurement values such as 120 volts, 121 volts, etc. The measurement value analog buckets 320 may include a first deviation cell below target 323, a first deviation cell above target 324, a last deviation cell below target 343, a last deviation cell above target 344, and a null value 321. The null value 321 may be a header of the byte map 300. The first deviation cell below target 323 may represent a value below the target 322. The first deviation cell below target 323 may be one deviation, or increment, below the target 322, where all the measurement value analog buckets 320 have values spaced apart according to the deviation. For example, the first deviation cell below target 323 may be 1 kV below the target 322 and the measurement value analog buckets 320 may all be spaced apart by 1 kV. The deviation may be a predefined, arbitrary number. The last deviation cell below target 343 may be the lowest value the byte map 300 contains. The last deviation cell below target 343 may be defined by a number of measurement value analog buckets 320 and the deviation. For example, if the target 322 is associated with the value 128 of the byte map 300 having 255 numeric values and the deviation is 1 kV, then the last deviation cell below target 343 may represent a value 127 kV below the target 322. Similarly, the last deviation cell above target 344 may be the highest value the byte map 300 contains. The last deviation cell above target 344 may be defined by a number of measurement value analog buckets 320 and the deviation. For example, if the target 322 is associated with the value 128 of the byte map 300 having 255 numeric values and the deviation is 1 kV, then the last deviation cell above target 344 may represent a value 127 kV above the target 322. In some embodiments, the measurement value analog buckets 320 may represent ranges of values. Each bucket of the measurement value analog buckets 320 may include values between subsequent measurement values. For example, the first deviation cell below target 323 may represent all values within 1 kV below the target 322, or all values from 1 kV below the target 322 up to the target 322.

Obviously, this approach is far less accurate and cannot represent these data values with the same resolution as a float or double, because now it represents a range without a specific decimal value.

Adaptive encoding and decoding, according to the present disclosure, can solve the problem of coarse measurement values by adapting the size of buckets in a byte map based on an expected, target value.

Figure 4:
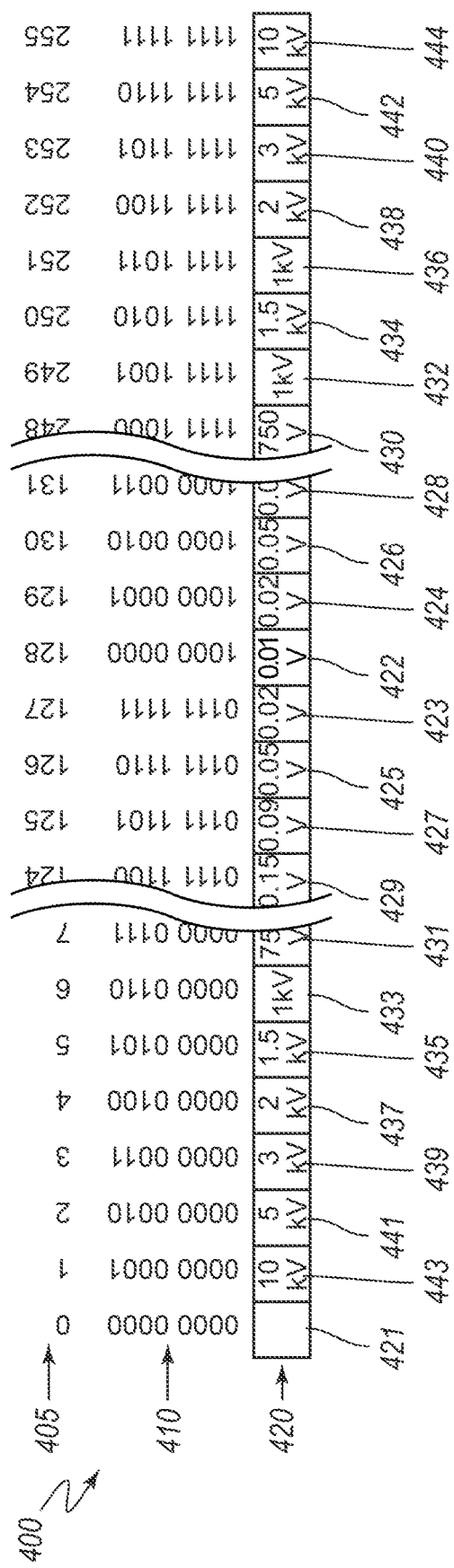
FIG. 4 is a byte map of an electrical monitoring system implementing relative adaptive decoding (and encoding), in accordance with one or more embodiments.

FIG. 4 is a byte map 400 of an electrical monitoring system implementing relative adaptive decoding (and encoding), in accordance with one or more embodiments. The byte map 400 may be similar to, or an example of, the lookup table employing an adaptable scale discussed herein. The byte map 400 may include numeric values 405 representing positions in the byte map 400. In some embodiments, the byte map 400 omits the numeric values 405. The byte map 400 may include bit values 410 and measurement value analog buckets 420. The bit values 410 may be the actual bits transmitted in packets. Each distinct byte of the bit values 410 may be associated with a measurement value analog bucket of the measurement value analog buckets 420. The measurement value analog buckets 420 may be arbitrary values defined in the byte map 400. The bit values 410 may be associated with measurement value analog buckets 420 having arbitrarily defined values.

The measurement value analog buckets 420 may include a target 422. The target 422 may be centered in the byte map

400 such that the target is associated with a value 128 of the numeric values 405. The target 422 may be an expected measurement value. For example, the byte map 400 may be used for measuring voltages in a residential application with an expected voltage of 120 volts and the byte map 400 may have a target 422 of 120 volts. In some embodiments, as shown here, the measurement value analog buckets 420 are denoted as relative to the target 422 such that the bucket associated with the target 422 is 0 or all values within 0.01 V of the target 422 and the measurement value analog buckets 420 are deviations from the target 422. In other embodiments, the measurement value analog buckets 420 are actual measurement values such as 120 volts, 121 volts, etc. The measurement value analog buckets 420 may include a first deviation cell below target 423, a first deviation cell above target 424, a last deviation cell below target 443, a last deviation cell above target 444, and a null value 421. The null value 421 may be a header of the byte map 400.

The first deviation cell below target 423 may represent a value below the target 422. The first deviation cell below target 423 may be one first deviation below the target 422. The first deviation may be a predefined number representing a first precision level. For example, the first deviation may be 0.02 V such that successive buckets of the measurement value analog buckets 420 using the first deviation represent values 0.02 V apart. In some embodiments, each successive bucket uses a different deviation. For example, each successive bucket from the target 422 may use a larger deviation such that more precise measurements are represented nearer the target 422 and less precise measurements are represented farther from the target 422. In some embodiments, the first deviation cell above target 424 may represent values between 0.01 V and 0.02 V above the target 422. A second deviation cell above target 426 may represent values between 0.02 V and 0.05 V above the target. The use of more precise measurements nearer the target 422 and less precise measurements farther from the target 422 provides an adaptive scale, where the precision of measurements is adapted to measure precise values around the target 422. By changing the target 422 to a new target, the scale is adapted to provide precision around the new target. Using a relative byte map, such as the byte map 400, allows for adapting the precision of measurements without updating the byte map 400. As long as the target 422 is updated, the same byte map 400 may be used to encode and decode values relative to the target 422.

If the values are changed to represent elements on an "adaptable" scale, we can use a lookup table to define the most significant (highest repeating) values. This scale can be adaptable as long as the Edge Intelligent device (coding and bit-packing the data) aligns its "look-up-table-assignments" with the back-end database, which is decrypting, then unpacking and decoding the data.

Using the same variance percentage example, we can create more granularity without using any more bits for storage/transmission, all within one byte, as illustrated in Table 1.

TABLE 1

| LUT Bin-Slot | Percent | Voltage |
|---|---|---|
| 0 | 0.50% | 0.6 V |
| 1 | 1.00% | 1.2 V |
| 2 | 1.50% | 1.8 V |
| 3 | 2.00% | 2.4 V |
| 4 | 2.50% | 3 V |

TABLE 1-continued

| LUT Bin-Slot | Percent | Voltage |
|---|---|---|
| ... | ... | ... |
| 195 | 98.00% | 117.6 V |
| 196 | 98.50% | 118.2 V |
| 197 | 99.00% | 118.8 V |
| 198 | 99.50% | 119.4 V |
| 199 | 100.00% | 120 V |

An adaptive decoding process enables adding half-percent accuracy to values. However, there are still 55 unused values.

Relative Adaptive Decoding (RAD)

When the values are compared against a baseline or standard, the lookup table can be changed to get even more accuracy. This means there is a standard or baseline value that is expected. The value is "usually" within a certain percentage of that baseline. Comparing against a baseline value is particularly useful for electrical property measurements, where the further away from baseline, the less important accuracy is—i.e., at that point we just need to know approximately how bad it is (that the customer must have fixed).

This approach of comparing against a baseline leads to a RAD scheme. When the value is close to the reference or target value, the look-up table can be designed so that the RAD scheme has extremely accurate values. When the value is far from the baseline, accuracy can be less important and in that case the look-up table values could instead be of a wider resolution (less precise).

Example: Voltage Measurement

In most cases, when measuring Voltage, accuracy is most important when the value is close to the expected Voltage (e.g., close to a baseline). For instance, a power line into a residential home in the US has Voltage and Amps (Current), among many other data points. The Voltage standard is 120 Volts. The average across the US is somewhere between 110 V and 120 V (e.g. 120 Volts+−6%).

Using this known average, the lookup table can be streamlined for even more accuracy, as shown in Table 2.

TABLE 2

| LUT Bin-Slot | Percent | Voltage |
|---|---|---|
| 0 | 2.00% | 2.4 V |
| 1 | 4.00% | 4.8 V |
| 2 | 6.00% | 7.2 V |
| 3 | 8.00% | 9.6 V |
| 4 | 10.00% | 12 V |
| ... | ... | ... |
| 180 | 90.00% | 108 V |
| 181 | 90.50% | 108.6 V |
| 182 | 91.00% | 109.2 V |
| 183 | 91.50% | 109.8 V |
| 184 | 92.00% | 110.4 V |
| ... | ... | ... |
| 239 | 99.00% | 118.8 V |
| 240 | 99.25% | 119.1 V |
| 241 | 99.50% | 119.4 V |
| 242 | 99.75% | 119.7 V |
| 243 | 99.80% | 119.76 V |
| 244 | 99.90% | 119.88 V |
| 245 | 99.99% | 119.988 V |
| 246 | 100.00% | 120 V |
| 247 | 100.25% | 120.3 V |
| 248 | 100.50% | 120.6 V |
| 249 | 100.75% | 120.9 V |

TABLE 2-continued

| LUT Bin-Slot | Percent | Voltage |
| --- | --- | --- |
| 250 | 101.00% | 121.2 V |
| 251 | 101.50% | 121.8 V |
| 252 | 102.00% | 122.4 V |
| 253 | 103.00% | 123.6 V |
| 254 | 105.00% | 126 V |
| 255 | 110.00% | 132 V |

By using all the available bin-slots, we can provide extreme accuracy the closer we get to the baseline (100%).

Since a Power Factor (P.F.) value lower than 70% is extremely rare, if even possible, we can remove some lower values (e.g., widen some of the bin-slot ranges representing lower values) and further improve accuracy as the value gets closer to the baseline, as shown in Table 3.

TABLE 3

| LUT Bin-Slot | Percent |
| --- | --- |
| 0 | 20.00% |
| 1 | 35.00% |
| 2 | 45.00% |
| 3 | 50.00% |
| 4 | 55.00% |
| ... | ... |
| 180 | 65.00% |
| 181 | 70.00% |
| 182 | 72.50% |
| 183 | 75.00% |
| 184 | 77.50% |
| ... | ... |
| 234 | 99.00% |
| 235 | 99.10% |
| 236 | 99.20% |
| 237 | 99.30% |
| 238 | 99.40% |
| 239 | 99.50% |
| 240 | 99.60% |
| 241 | 99.70% |
| 242 | 99.80% |
| 243 | 99.85% |
| 244 | 99.90% |
| 245 | 99.94% |
| 246 | 99.97% |
| 247 | 100.00% |
| 248 | 100.03% |
| 249 | 100.06% |
| 250 | 101.00% |
| 251 | 101.05% |
| 252 | 101.10% |
| 253 | 101.20% |
| 254 | 101.50% |
| 255 | 102.50% |

As another alternative, we can reduce the number of bits used. Instead of one byte (8 bits), we can use 5 bits instead, which will give us 32 possible bin-slots, as shown in Table 4.

Some examples using a standard of 120 V: A Voltage of 117 V is 97.5% of 120 V, so the bin-slot would be 21 (97%). A Voltage of 118.5 V (98.75%) would have a bin-slot of 23 (98.5%). A Voltage of 112 V (93%) would have a bin-slot of 17 (93%).

TABLE 4

| LUT Bin-Slot | Percent | Voltage | Voltage (Normal Range 110 V-120 V) |
| --- | --- | --- | --- |
| 0 | 5.00% | 6 V | |
| 1 | 10.00% | 12 V | |
| 2 | 20.00% | 24 V | |
| 3 | 40.00% | 48 V | |
| 4 | 60.00% | 72 V | |
| 5 | 70.00% | 84 V | |
| 6 | 75.00% | 90 V | |
| 7 | 80.00% | 96 V | |
| 8 | 83.00% | 99.6 V | |
| 9 | 85.00% | 102 V | |
| 10 | 86.00% | 103.2 V | |
| 11 | 87.00% | 104.4 V | |
| 12 | 89.00% | 106.8 V | |
| 13 | 90.00% | 108 V | |
| 14 | 91.00% | 109.2 V | |
| 15 | 92.00% | | 110.4 V |
| 16 | 93.00% | | 111.6 V |
| 17 | 94.00% | | 112.8 V |
| 18 | 95.00% | | 114 V |
| 19 | 96.00% | | 115.2 V |
| 20 | 97.00% | | 116.4 V |
| 21 | 97.50% | | 117 V |
| 22 | 98.00% | | 117.6 V |
| 23 | 98.50% | | 118.2 V |
| 24 | 99.00% | | 118.8 V |
| 25 | 99.50% | | 119.4 V |
| 26 | 99.80% | | 119.76 V |
| 27 | 99.90% | | 119.88 V |
| 28 | 99.95% | | 119.94 V |
| 29 | 100.00% | | 120 V |
| 30 | 102.00% | 122.4 V | |
| 31 | 105.00% | 126 V | |

Using a reference value, measured at the time of installation, the accuracy can be improved further still, by taking a Voltage measurement at the installation process and using that instead as the initial center-point or baseline.

The encoded voltage center-point measurement can be transmitted, as discussed above, in a small packet, such as an 11-byte packet to a server.

Figure 5:
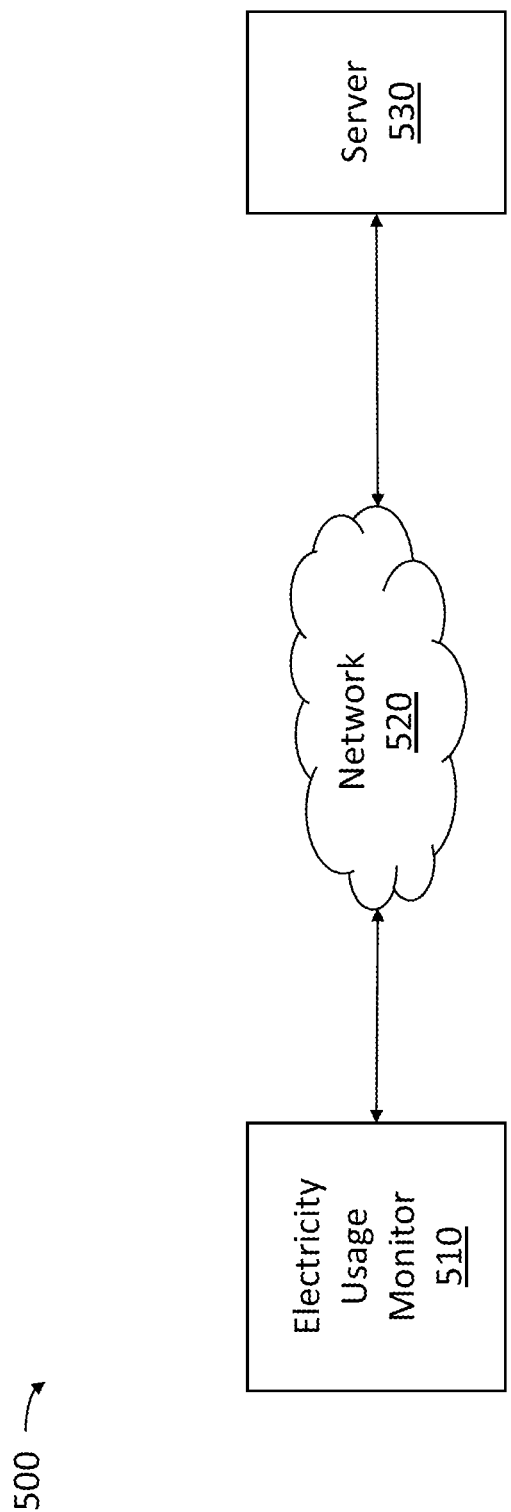
FIG. 5 is a diagrammatic view of an environment in which electricity monitoring and data transmission may occur, in accordance with one or more embodiments.

FIG. 5 illustrates an environment 500 in which one or more embodiments may take place or otherwise be implemented. The environment 500 may include an electricity usage monitor 510, a network 520, and a server 530. The electricity usage monitor 510 may be a device that monitors voltage, power factor, and apparent energy. The electricity monitor 510 may communicate voltage, power factor, and apparent energy to the server 530 through the network 520. The network may be any network such as an IoT network such as LoRaWAN or SigFox, as discussed herein. The electricity usage monitor 510 and the server 530 may have matching lookup tables. Communication over the network 520 may be limited, as discussed herein. The electricity usage monitor 510 and the server 530 may communicate using small packets. Data may be compressed using a lookup table or other methods to be sent between the electricity usage monitor 510 and the server 530. For example, the electricity usage monitor 510 may encode a voltage measurement as a lookup table position and transmit a packet containing the lookup table position through the network 520 to the server 530. The server 530 may receive the lookup table position and decode the lookup table position using its matching lookup table to determine the voltage measurement.

Figure 6:
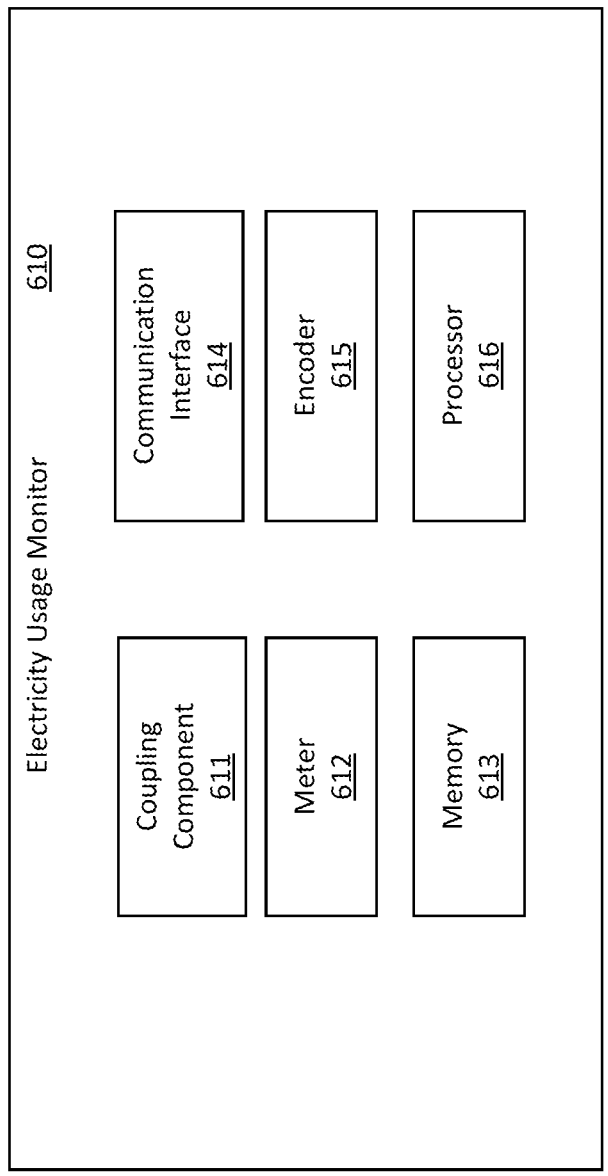
FIG. 6 is a diagrammatic view of an electricity usage monitor, in accordance with one or more embodiments.

FIG. 6 illustrates a block diagram of an electricity usage monitor 610, in accordance with one or more embodiments. The electricity usage monitor 610 may include a coupling component 611, a meter 612, a memory 613, a communication interface 614, an encoder 615, and a processor 616. The electricity usage monitor 610 may be an example of the electricity usage monitor 510 of FIG. 5. The coupling component 611 may couple the electricity usage monitor 610 to an electrical wire such that the electricity usage monitor 610 can measure a voltage, a power factor, and an apparent energy of the wire using the meter 612. The memory 613 may store electrical measurements as well as historical electrical usage measurements. The memory 613 may store a lookup table used to encode electrical measurements. The memory 613 may store instructions for generating packets including the encoded electrical measurements to be transmitted to a server. The communication interface 614 may be configured to send and receive packets from the server. The communication interface may be configured to communicate with the server wirelessly over a network, such as LoRaWAN or SigFox. The encoder 615 may be configured to encode electrical measurements captured by the meter 612 in packets using the lookup table. The processor 616 may be configured to communicate with the memory 613 and control the communication interface 614 and the encoder 615. In some embodiments, the encoder 615 is a program stored in the memory 613 and executed by the processor 616.

Figure 7:
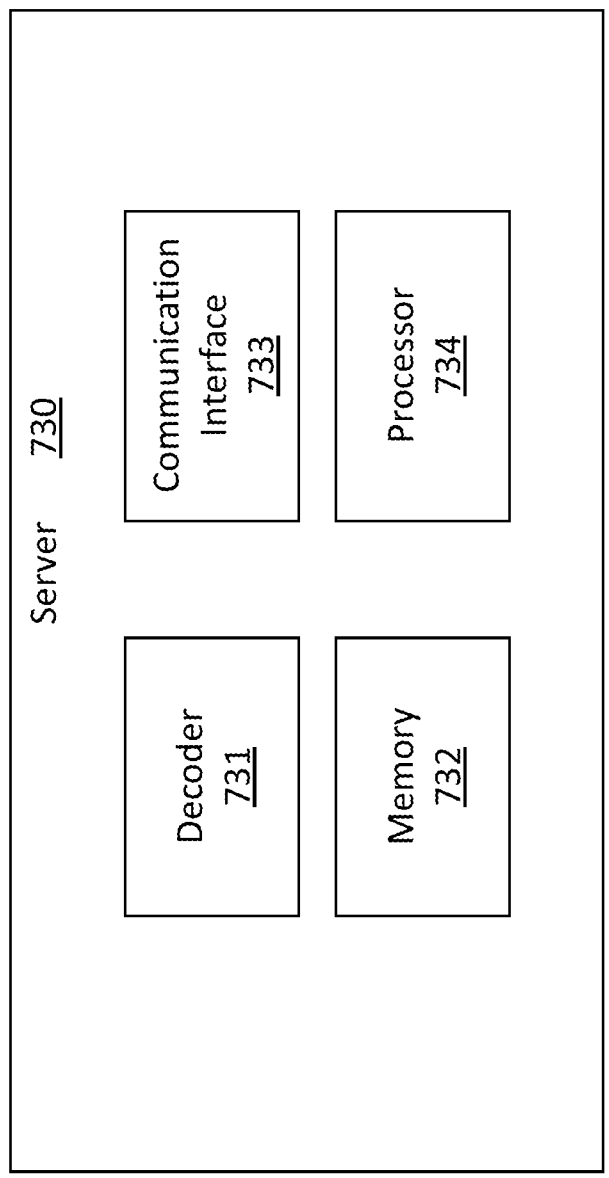
FIG. 7 is a diagrammatic view of a server, in accordance with one or more embodiments.

FIG. 7 illustrates a server 730, in accordance with one or more embodiments. The server 730 may include a decoder 731, a memory 732, a communication interface 733, and a processor 734. The server 730 may be an example of the server 510 of FIG. 5. The decoder 731 may be configured to decode packets received from an electricity usage monitor using a lookup table which matches an electricity usage monitor lookup table used to encode electricity usage measurements. The memory 732 may include instructions for decoding the packets from the electricity usage monitor. The communication interface 733 may be configured to send and receive packets from the electricity usage monitor over a network. The processor 734 may be coupled to the memory 732 and may be configured to control the decoder 731 and the communication interface 733. In some embodiments, the decoder 731 is a program stored in the memory 732 and executed by the processor 734.

Figure 8:
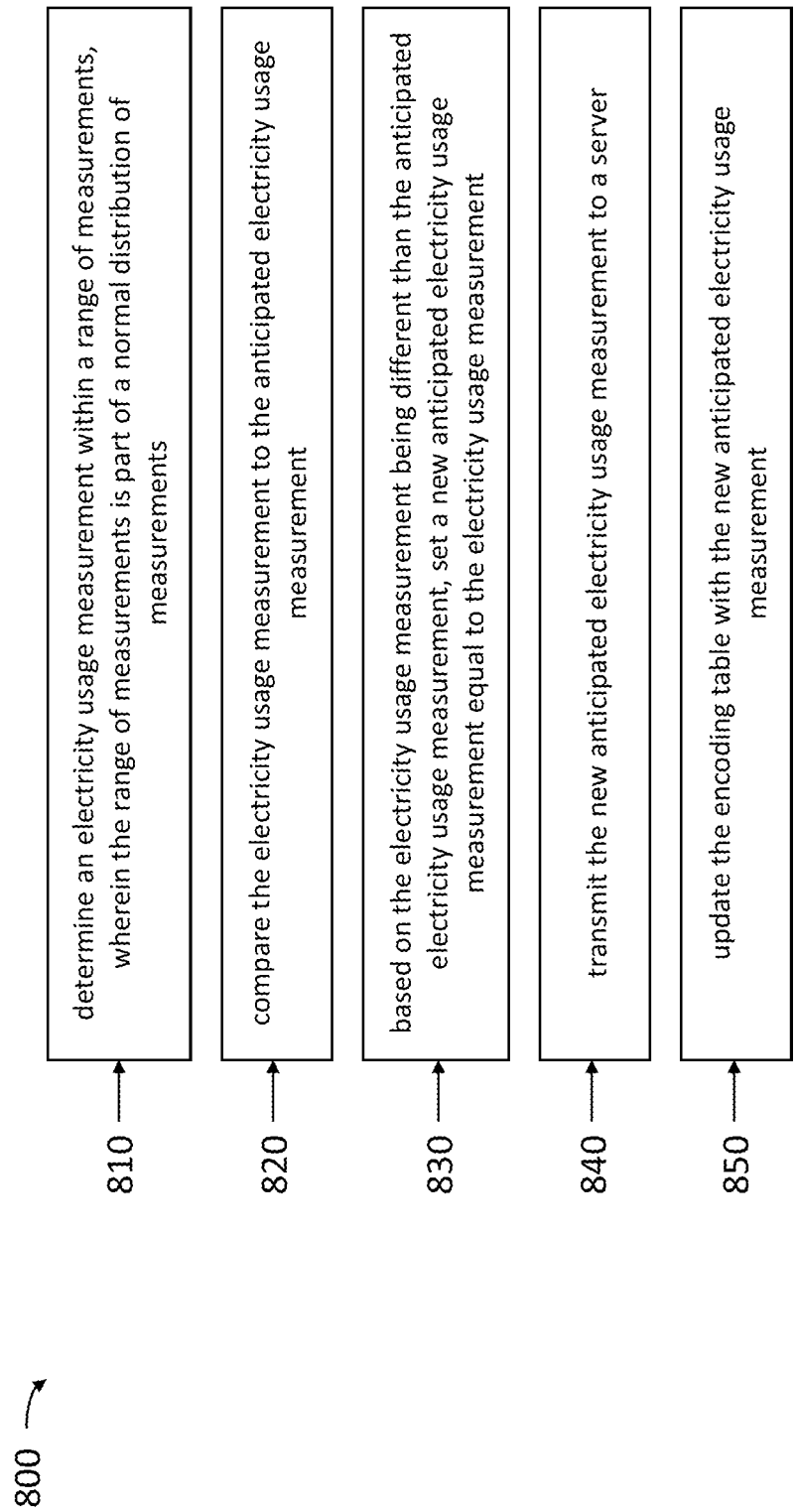
FIG. 8 illustrates a flowchart depicting operations for adaptive encoding, in accordance with one or more embodiments.

FIG. 8 illustrates a flowchart 800 depicting operations for adaptive encoding, in accordance with one or more embodiments. Additional or fewer steps may be included in the operations. Furthermore, the operations may be in a different order than depicted.

An electricity usage monitor determines 810 an electricity usage measurement within a range of measurements, wherein the range of measurements is part of a normal distribution of measurements.

The electricity usage monitor can compare 820 the electricity usage measurement rolling average to an anticipated electricity usage measurement. The rolling average may be determined based on a window of any length in time, such as a minute, an hour, a day, a month, or a year. In an example, the electricity usage-rolling-average becomes 115 volts from a normal distribution of voltages where it is statistically significant in value from an anticipated electricity usage measurement of 118 volts. In some embodiments, comparing the electricity measurement to the anticipated electricity usage measurement includes calculating a number of standard deviations from the anticipated electricity usage measurement. In other embodiments, comparing the electricity measurement to the anticipated electricity usage measurement includes calculating a rolling percentage variance.

The electricity usage monitor, based on the electricity usage measurement being different than the anticipated electricity usage measurement, sets 830 a new anticipated electricity usage measurement equal now to the electricity usage rolling average. In some embodiments, the electricity usage measurement being different than the anticipated electricity usage measurement includes the rolling average of the electricity usage measurement being a number of standard deviations from the anticipated electricity usage measurement. In other embodiments, the electricity usage measurement being different than the anticipated electricity usage measurement includes the rolling average of the electricity usage measurement being a predetermined percent variance (e.g., 20) from the anticipated electricity usage measurement. In yet other embodiments, the electricity usage measurements being different than the anticipated electricity usage measurement includes the rolling average of the electricity usage measurement being a predetermined number of lookup table buckets from the anticipated electricity usage measurement.

The electricity usage monitor transmits 840 the new anticipated electricity usage measurement to a server and the monitor may receive back an acknowledgement from the server that the new anticipated electricity usage will be used in the decoding measurement transmits for the look up table.

The electricity usage monitor updates 850 the encoding table with the new anticipated electricity usage measurement. In some embodiments, the encoding table is updated such that a relative relationship between the prime band and the excursion bands is preserved when the plurality of ranges are updated. For example, the prime band may include values one standard deviation above and one standard deviation below the mean of a normal distribution and updating the encoding table means to preserve the normal distribution while shifting the mean of the normal distribution.

The electricity usage monitor may repeat the process 800 until a correct or otherwise appropriate anticipated electricity usage measurement is found. For example, the electricity usage monitor may repeat the process of determining a subsequent electricity usage measurement, comparing the subsequent electricity usage measurement to the anticipated electricity usage measurement, setting an updated new anticipated electricity usage measurement equal to the subsequent electricity usage measurement, transmitting the updated new anticipated electricity usage measurement to the server, and updating the encoding table with the updated new anticipated electricity usage measurement until the new electricity usage measurement is within a predefined threshold of the new electricity usage measurement. For example, if the anticipated electricity usage measurement is 119.98-120 volts but the electricity usage measurement is 240 volts, the bin including 240 volts may be sized such that it covers 200-250 volts, due to 240 volts being so far away from 120 volts that it is more than 2 standard deviations away from 120 volts. Updating the encoding table with the new anticipated electricity usage measurement of 200-250 volts may cause the new center of the distribution to be 224.98-225 volts. A subsequent measurement of 240 volts will cause the center of the distribution to shift again, but in a smaller step size than the previous shift because the electricity usage measurement is not as far away from the mean as in the previous shift. The encoding table may be updated in iterations of these shifts until the electricity usage measurement is within a predefined threshold, such as 0.5 volts, of the anticipated electricity usage threshold.

Figure 9:
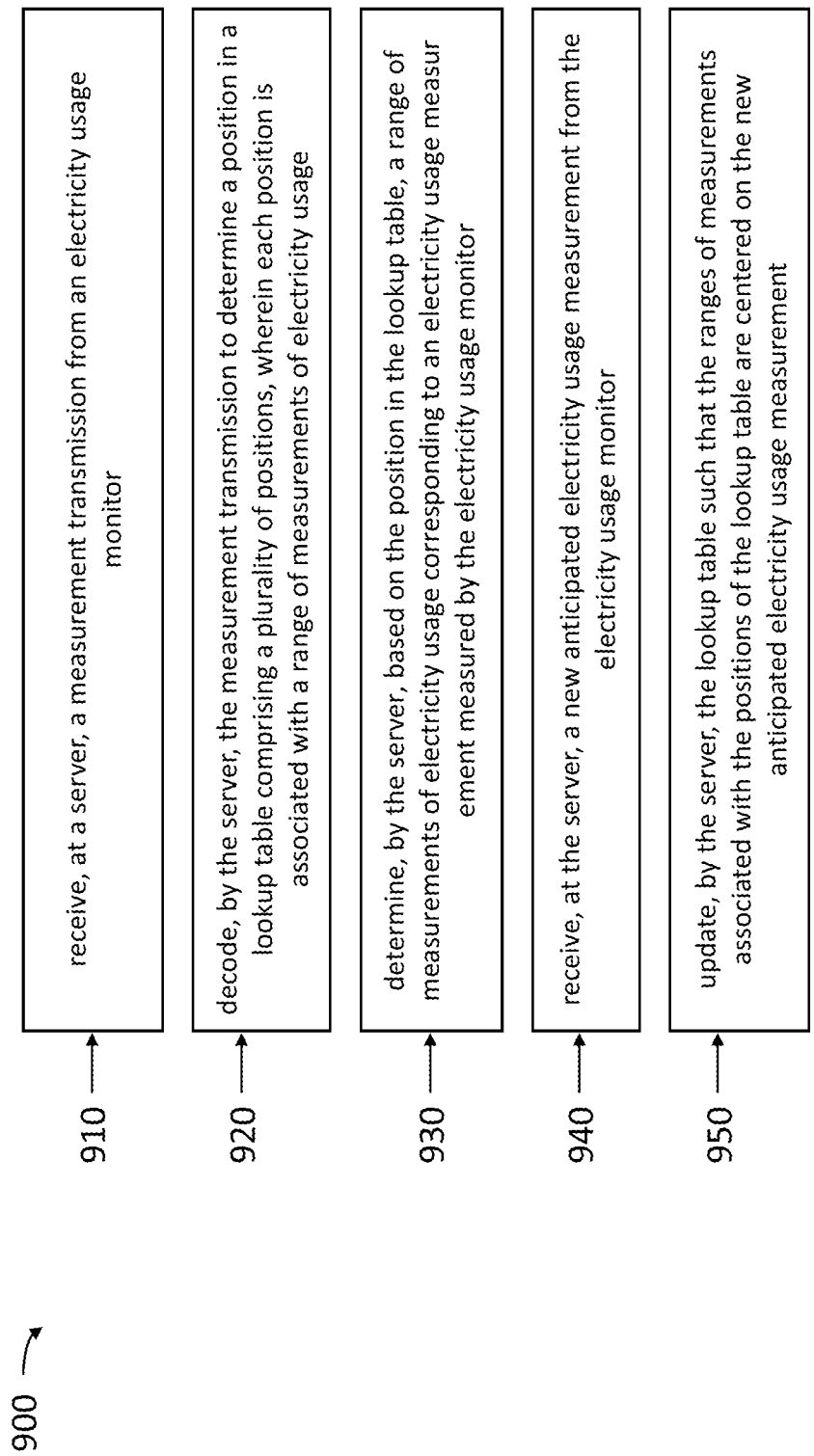
FIG. 9 illustrates a flowchart depicting operations for adaptive decoding, in accordance with one or more embodiments.

FIG. 9 illustrates a flowchart 900 depicting operations for adaptive decoding, in accordance with one or more embodiments. Additional or fewer steps may be included in the operations. Furthermore, the operations may be in a different order than depicted.

A server may receive 910 a measurement transmission from an electricity usage monitor.

The server may decode 920 the measurement transmission to determine a position in a lookup table comprising a plurality of positions, wherein each position is associated with a range of measurements of electricity usage. In some embodiments, the ranges of measurements of electricity usage in the lookup table comprise a prime band and a plurality of excursion bands, wherein the prime band includes a first subset of the plurality of ranges of measurements having a first degree of precision and comprises an anticipated electricity usage measurement, and each excursion band of the plurality of excursion bands includes a subset of the plurality of ranges of measurements having a degree of precision less than the first degree of precision. For example, the ranges of measurements of electricity usage in the lookup table may follow a normal distribution, where measurements nearer the anticipated electricity usage measurement at the center of the normal distribution have a higher degree of precision than measurements farther from the anticipated electricity usage measurement such that more positions are dedicated to values the nearer the anticipated electricity measurement. The lookup table may match a lookup table of the electricity usage monitor such that encoding at the electricity usage monitor and decoding at the server successfully transmits an electricity usage measurement.

The server may determine 930, based on the position in the lookup table, a range of measurements of electricity usage corresponding to an electricity usage measurement measured by the electricity usage monitor.

The server may receive 940 a new anticipated electricity usage measurement from the electricity usage monitor.

The server may update 950 the lookup table such that the ranges of measurements associated with the positions of the lookup table are centered on the new anticipated electricity usage measurement. In some embodiment, centering the ranges of measurements on the new anticipated electricity usage measurement includes centering the prime band on the new anticipated electricity usage measurement. In some embodiments, the lookup table is updated such that a relative relationship between the prime band and the excursion bands is preserved. For example, the prime band and the excursion bands may represent a normal distribution, wherein a center of the normal distribution is the anticipated electricity usage measurement, and wherein updating the plurality of ranges of measurements comprises shifting the normal distribution such that the center is the new anticipated electricity usage measurement. The operations of the flowchart 900 may be repeated until a subsequent electricity measurement is within a predefined threshold of a new anticipated electricity usage measurement as discussed in conjunction with FIG. 8. In some embodiments, the server may transmit a message to the electricity usage monitor to retain the new anticipated electricity usage measurement.

The server may store decoded measurements in the memory of the server. The decoded measurements may be values corresponding to the measurements captured by the electricity usage monitor. For example, the server may store voltage and/or power-factor values corresponding to voltages and power-factors measured by the electricity usage monitor.

In an example, an electricity usage monitor is coupled to an electric wire for the purpose of measuring electric usage. The electricity usage monitor measures voltage, power factor, and apparent energy for three phases of power such that electricity usage can be calculated. Voltage, power factor, and apparent energy need to be measured and transmitted together for accurate calculation of electricity usage. If these three values (nine for all three phases) are sent separately, they may not arrive at a server at the same time, causing errors in calculating electricity usage. Additionally, the electricity usage monitor communicates with the server over an IoT network which requires small packet sizes of 11 bytes. The electricity usage monitor uses a lookup table to encode electricity usage measurements as positions in the lookup table. The lookup table includes a prime band of values near 120 volts, an anticipated voltage measurement, and excursion bands representing values within different standard deviations from 120 volts. The number of positions in the lookup table occupied in the lookup table in each band may correspond to the probability, or expected frequency, according to a normal distribution, of each value being measured. Thus the prime band, corresponding to one standard deviation from 120 volts covers 115-125 volts while occupying 68% of the positions in the lookup table while a first excursion band, corresponding to two standard deviations above 120 volts, covers 125-130 volts while occupying 14% of the positions in the lookup table. This gives greater precision to values nearer 120 volts than is afforded to values farther from 120 volts. The electricity usage monitor measures a voltage, encodes that voltage as a position in the lookup table, and transmits a packet including the position in the lookup table to a server. The server decodes the position in the lookup table using a lookup table identical to the lookup table used by the electricity usage monitor to determine the voltage measured by the electricity usage monitor. When the electricity usage monitor measures a voltage outside of the prime band, the electricity usage monitor updates the lookup table by associating new voltage values with positions in the lookup table. When the electricity usage monitor measures a voltage of 114 volts, outside of the prime band, the lookup table is updated to be centered on 114 volts to increase a precision of measurement around 114 volts, a new anticipated electricity usage measurement. The new prime band covers 104-119 volts, while the relative size and position of the prime band and the excursion bands remains the same. Before updating the lookup table, the electricity usage monitor sends a message to the server to update the server lookup table to match the updated lookup table of the electricity usage monitor. Once the electricity usage monitor receives an acknowledgement from the server of the updated server lookup table, the electricity usage monitor updates, or finalizes the update, of its lookup table. As the server receives messages from the electricity usage monitor, the server decrypts the messages, reads the messages to obtain positions in the lookup table corresponding to variance percentages from the anticipated electricity usage measurement, calculates measurement values from the variance percentages and the anticipated electricity usage measurement, and stores the measurement values in a database. Thus, encoding voltage measurements in the updated lookup table results in accurate decoding of voltage measurements from the lookup table at the server. The same process may be used for encoding measurements and updating lookup tables for power factor and apparent energy. The messages the electricity usage monitor sends the server may include lookup table positions for lookup tables for multiple parameters of electricity usage. For example, the messages may include lookup table positions for lookup tables for voltage and power factor for three phases of power. Different statistical distributions may be used for building the lookup tables for encoding different measurements, such as power factor and apparent energy.

EXAMPLES

Example 1. An electricity usage monitor including a coupling component to couple the electricity usage monitor to monitor an electrical circuit, a meter to measure electricity usage of the electrical circuit, an encoder to receive, from the meter, an electricity usage measurement to generate a measurement transmission based on the electricity usage measurement, the measurement transmission including an arrangement of bits that represents a range of measurements that includes the electricity usage measurement wherein the range of measurements is one of a plurality of ranges of measurements, the plurality of ranges of measurements including a prime band and a plurality of excursion bands, wherein the prime band includes a first subset of the plurality of ranges of measurements having a first degree of precision and includes an anticipated electricity usage measurement, and each excursion band of the plurality of excursion bands includes a subset of the plurality of ranges of measurements having a degree of precision less than the first degree of precision, and a communication interface configured to receive the measurement transmission from the encoder and to transmit the measurement transmission into a communication network for communication to a destination on the communication network.

Example 2. The electricity usage monitor of example 1, wherein each excursion band is wider than the prime band, such that each excursion band represents a wider range of ranges of measurements than the prime band.

Example 3. The electricity usage monitor of example 1, wherein the destination includes a decoding component configured to identify, from the arrangement of bits received from the communication interface via the communication network, the range of measurements of the measurement analog assigned by the encoder.

Example 4. The electricity usage monitor of example 1, wherein the electricity usage is measured in at least one of voltage, amperage, resistance, and a power factor.

Example 5. The electricity usage monitor of example 1, wherein the anticipated electricity usage measurement of electricity usage is a calculation based on material properties of the electrical circuit.

Example 6. The electricity usage monitor of example 1, wherein the anticipated electricity usage measurement of electricity usage is a calculation based on a recurrence of measurements of electricity usage at the electrical circuit.

Example 7. The electricity usage monitor of example 1, wherein the measurement transmission includes a bit count within a limitation of a communication protocol of the communication network.

Example 8. An electricity usage monitor including a processor configured to determine an electricity usage measurement within a range of measurements wherein the range of measurements is one of a plurality of ranges of measurements in an encoding table, the plurality of ranges of measurements including a prime band and a plurality of excursion bands, wherein the prime band includes a first subset of the plurality of ranges of measurements having a first degree of precision and includes an anticipated electricity usage measurement, and each excursion band of the plurality of excursion bands includes a subset of the plurality of ranges of measurements having a degree of precision less than the first degree of precision, compare the electricity usage measurement to the anticipated electricity usage measurement, based on the electricity usage measurement being different than the anticipated electricity usage measurement, set a new anticipated electricity usage measurement equal to the electricity usage measurement, transmit the new anticipated electricity usage measurement to a server, and update the encoding table with the new anticipated electricity usage measurement.

Example 9. The electricity usage monitor of example 8, wherein comparing the electricity usage measurement to the anticipated electricity usage measurement includes calculating a number of standard deviations from the anticipated electricity usage measurement.

Example 10. The electricity usage monitor of example 8, wherein the processor is further configured to update the encoding table with the new anticipated electricity usage measurement such that the prime band is centered on the new anticipated electricity usage measurement.

Example 11. The electricity usage monitor of example 10, wherein the encoding table is updated such that a relative relationship between the prime band and the excursion bands is preserved when the plurality of ranges are updated.

Example 12. The electricity usage monitor of example 11, wherein the plurality of ranges in the encoding table represent a normal distribution, wherein a center of the normal distribution is the anticipated electricity usage measurement, and wherein updating the plurality of ranges of measurements includes shifting the normal distribution such that the center is the new anticipated electricity usage measurement.

Example 13. The electricity usage monitor of example 8, wherein the processor is further configured to determine a subsequent electricity usage measurement, compare the subsequent electricity usage measurement to the new anticipated electricity usage measurement, update the new anticipated electricity usage measurement based on the subsequent electricity usage measurement being different from the new anticipated electricity usage measurement, and update the encoding table with the updated new anticipated electricity usage measurement.

Example 14. The electricity usage monitor of example 13, wherein the processor is further configured to take further subsequent electricity usage measurements and update the encoding table with the updated new anticipated electricity usage measurement until the subsequent electricity usage measurement is within a predefined threshold of the updated new anticipated electricity usage measurement.

Example 15. A non-transitory, computer-readable medium including instructions which, when executed by a processor, cause the processor to receive, at a server, a measurement transmission from an electricity usage monitor, decode, by the server, the measurement transmission to determine a position in a lookup table including a plurality of positions, wherein each position is associated with a range of measurements of electricity usage, determine, by the server, based on the position in the lookup table, a range of measurements of electricity usage corresponding to the electricity usage measurement measured by the electricity usage monitor, receive, at the server, a new anticipated electricity usage measurement from the electricity usage monitor, and update, by the server, the lookup table such that the ranges of measurements associated with the positions of the lookup table are centered on the new anticipated electricity usage measurement.

Example 16. The medium of example 15, wherein the ranges of measurements of electricity usage in the lookup table include a prime band and a plurality of excursion bands, wherein the prime band includes a first subset of the plurality of ranges of measurements having a first degree of precision and includes an anticipated electricity usage measurement, and each excursion band of the plurality of excursion bands includes a subset of the plurality of ranges of measurements having a degree of precision less than the first degree of precision.

Example 17. The medium of example 16, further including instructions which cause the processor to update the lookup table with the new anticipated electricity usage measurement such that the prime band is centered on the new anticipated electricity usage measurement.

Example 18. The medium of example 17, further including instructions which cause the processor to update the lookup table such that a relative relationship between the prime band and the excursion bands is preserved.

Example 19. The medium of example 18, wherein the ranges of measurements of electricity usage in the lookup table represent a normal distribution, wherein a center of the normal distribution is the anticipated electricity usage measurement, and wherein updating the plurality of ranges of measurements includes shifting the normal distribution such that the center is the new anticipated electricity usage measurement.

Example 20. The medium of example 17, further including instructions which cause the processor to receive, at the server, a subsequent electricity usage measurement, compare, by the server, the subsequent electricity usage measurement to the new anticipated electricity usage measurement, and based upon the subsequent electricity usage measurement being within a predefined threshold of the new anticipated electricity usage measurement, transmit a message to the electricity usage monitor to retain the new anticipated electricity usage measurement.

Example 21. An electricity usage monitoring server comprising: one or more processors to: receive, from the communication interface, a measurement transmission including an electricity usage measurement, the measurement transmission comprising an arrangement of bits that represents a range of measurements that includes the electricity usage measurement, wherein the range of measurements is one of a plurality of ranges of measurements, the plurality of ranges of measurements comprising a prime band and a plurality of excursion bands, wherein the prime band includes a first subset of the plurality of ranges of measurements having a first degree of precision and comprises an anticipated electricity usage measurement, and wherein each excursion band of the plurality of excursion bands includes a subset of the plurality of ranges of measurements having a degree of precision less than the first degree of precision; and a communication interface configured to receive the measurement transmission from the encoder and to transmit the measurement transmission into a communication network for communication to a destination on the communication network.

Example 22. An electricity usage monitoring server comprising: a decoder to decode, from a measurement transmission received over a communication network from an electricity usage monitoring device via a communication interface, an electricity usage measurement within a range of measurements, wherein the range of measurements is one of a plurality of ranges of measurements in a decoding table, the plurality of ranges of measurements comprising a prime band and a plurality of excursion bands, wherein the prime band includes a first subset of the plurality of ranges of measurements having a first degree of precision and comprises an anticipated electricity usage measurement, and each excursion band of the plurality of excursion bands includes a subset of the plurality of ranges of measurements having a degree of precision less than the first degree of precision; compare the electricity usage measurement to the anticipated electricity usage measurement; based on the electricity usage measurement being different than the anticipated electricity usage measurement, set a new anticipated electricity usage measurement equal to the electricity usage measurement; transmit, by a communication interface, the new anticipated electricity usage measurement to the electricity usage monitoring device; and update the decoding table with the new anticipated electricity usage measurement.

Example 23. An electricity usage monitoring system comprising: an electricity usage monitor comprising: a coupling component to couple the electricity usage monitor to monitor an electrical circuit; a meter to measure electricity usage of the electrical circuit; an encoder to receive, from the meter, an electricity usage measurement to generate a measurement transmission based on the electricity usage measurement, the measurement transmission comprising an arrangement of bits that represents a range of measurements that includes the electricity usage measurement, wherein the range of measurements is one of a plurality of ranges of measurements, the plurality of ranges of measurements comprising a prime band and a plurality of excursion bands, wherein the prime band includes a first subset of the plurality of ranges of measurements having a first degree of precision and comprises an anticipated electricity usage measurement, and wherein each excursion band of the plurality of excursion bands includes a subset of the plurality of ranges of measurements having a degree of precision less than the first degree of precision; and a device communication interface configured to receive the measurement transmission from the encoder and to transmit the measurement transmission into a communication network for communication to a destination on the communication network; and an electricity usage monitoring server comprising: a decoder to: receive, over the communication network from the electricity monitoring device, the measurement transmission; and decode, from the measurement transmission, the electricity usage measurement.

Example 24. The electricity usage monitoring system of Example 23, wherein the electricity usage monitoring server further comprises: one or more processors to: compare the electricity usage measurement to the anticipated electricity usage measurement; based on the electricity usage measurement being different than the anticipated electricity usage measurement, set a new anticipated electricity usage measurement equal to the electricity usage measurement; transmit, by a server communication interface, the new anticipated electricity usage measurement to the electricity usage monitoring device; and update the decoding table with the new anticipated electricity usage measurement.

While the principles of this disclosure have been shown in various embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure.

It will be obvious to those having skill in the art that many changes may be made to the details of the above-described embodiments without departing from the underlying principles of the invention. The scope of the present invention should, therefore, be determined only by the claims.

What is claimed is:

1. An electricity usage monitor comprising:
a coupling component to couple the electricity usage monitor to an electrical circuit;
a measuring device to measure electricity usage of the electrical circuit;
an encoder to generate a measurement transmission based on the electricity usage measurement, the measurement transmission comprising an arrangement of bits that represents a range of measurements that includes the electricity usage measurement, wherein the range of measurements is one of a plurality of ranges of measurements, the plurality of ranges of measurements comprising:
   a first band including a first subset of the plurality of ranges of measurements having a first degree of precision, the first subset including an anticipated electricity usage measurement; and
   a second band including a second subset of the plurality of ranges of measurements having a second degree of precision less than the first degree of precision; and
a communication interface to transmit the measurement transmission into a communication network for communication to a destination on the communication network.

2. The electricity usage monitor of claim 1, wherein the second band is wider than the prime band, such that the second band represents a wider range of ranges of measurements than the first band.

3. The electricity usage monitor of claim 1, wherein the destination comprises a decoding component configured to identify, from the arrangement of bits received from the communication interface via the communication network, the range of measurements represented by the measurement transmission.

4. The electricity usage monitor of claim 1, wherein the electricity usage is measured in at least one of voltage, amperage, resistance, and a power factor.

5. The electricity usage monitor of claim 1, wherein the anticipated electricity usage measurement of electricity usage is a calculation based on material properties of the electrical circuit.

6. The electricity usage monitor of claim 1, wherein the anticipated electricity usage measurement of electricity usage is a calculation based on a recurrence of measurements of electricity usage at the electrical circuit.

7. The electricity usage monitor of claim 1, wherein the measurement transmission includes a bit count within a limitation of a communication protocol of the communication network.

8. An electricity usage monitor comprising:
a communication network interface; and
one or more processors to:
   determine an electricity usage measurement within a range of measurements, wherein the range of measurements is one of a plurality of ranges of measurements in an encoding table, the plurality of ranges of measurements comprising a first band and a second band, wherein the first band includes a first subset of the plurality of ranges of measurements having a first degree of precision and comprises an anticipated electricity usage measurement, and the second band includes a second subset of the plurality of ranges of measurements having a degree of precision less than the first degree of precision;
   compare the electricity usage measurement to the anticipated electricity usage measurement;
   based on the electricity usage measurement being different than the anticipated electricity usage measurement, set a new anticipated electricity usage measurement according to the electricity usage measurement;
   transmit, by the communication interface, the new anticipated electricity usage measurement to a server; and
   update the encoding table with the new anticipated electricity usage measurement.

9. The electricity usage monitor of claim 8, wherein the one or more processors compare the electricity usage measurement to the anticipated electricity usage measurement by calculating a number of standard deviations from the anticipated electricity usage measurement.

10. The electricity usage monitor of claim 8, wherein the one or more processors are further configured to update the encoding table with the new anticipated electricity usage measurement such that the first band is centered on the new anticipated electricity usage measurement.

11. The electricity usage monitor of claim 10, wherein the encoding table is updated such that a relative relationship between the first band and the second band is preserved when the plurality of ranges are updated.

12. The electricity usage monitor of claim 11, wherein the plurality of ranges in the encoding table represent a normal distribution, wherein a center of the normal distribution is the anticipated electricity usage measurement, and wherein updating the plurality of ranges of measurements comprises shifting the normal distribution such that the center is the new anticipated electricity usage measurement.

13. The electricity usage monitor of claim 8, wherein the one or more processors are further configured to:
   determine a subsequent electricity usage measurement;
   compare the subsequent electricity usage measurement to the new anticipated electricity usage measurement;
   update the new anticipated electricity usage measurement based on the subsequent electricity usage measurement being different from the new anticipated electricity usage measurement; and
   update the encoding table with the updated new anticipated electricity usage measurement.

14. The electricity usage monitor of claim 13, wherein the one or more processors are further configured to take further subsequent electricity usage measurements and update the encoding table with the updated new anticipated electricity usage measurement until the subsequent electricity usage measurement is within a predefined threshold of the updated new anticipated electricity usage measurement.

15. A non-transitory, computer-readable medium comprising instructions which, when executed by a processor, cause the processor to:
   receive, at a server, a measurement transmission from an electricity usage monitor;
   decode, by the server, the measurement transmission to determine a position in a lookup table comprising a plurality of positions, wherein each position is associated with a range of measurements of electricity usage;
   determine, by the server, based on the position in the lookup table, a range of measurements of electricity usage corresponding to an electricity usage measurement measured by the electricity usage monitor;
   receive, at the server, a new anticipated electricity usage measurement from the electricity usage monitor; and update, by the server, the lookup table such that the ranges of measurements associated with the positions of the lookup table are centered on the new anticipated electricity usage measurement.

16. The medium of claim 15, wherein the ranges of measurements of electricity usage in the lookup table comprise a first band and a second band, wherein the first band includes a first subset of the plurality of ranges of measurements having a first degree of precision and comprises an anticipated electricity usage measurement, and the second band includes a second subset of the plurality of ranges of measurements having a degree of precision less than the first degree of precision.

17. The medium of claim 16, further comprising instructions which cause the processor to update, by the processor, the lookup table with the new anticipated electricity usage measurement such that the first band is centered on the new anticipated electricity usage measurement.

18. The medium of claim 17, further comprising instructions which cause the processor to update, by the server, the lookup table such that a relative relationship between the first band and the second band is preserved.

19. The medium of claim 18, wherein the ranges of measurements of electricity usage in the lookup table represent a normal distribution, wherein a center of the normal distribution is the anticipated electricity usage measurement, and wherein updating the plurality of ranges of measurements comprises shifting the normal distribution such that the center of the normal distribution is the new anticipated electricity usage measurement.

20. The medium of claim 17, further comprising instructions which cause the processor to:
receive, at the server, a subsequent electricity usage measurement;
compare, by the server, the subsequent electricity usage measurement to the new anticipated electricity usage measurement; and
based upon the subsequent electricity usage measurement being within a predefined threshold of the new anticipated electricity usage measurement, transmit a message to the electricity usage monitor to retain the new anticipated electricity usage measurement.

* * * * *